(12) United States Patent
Kim

(10) Patent No.: US 7,273,782 B2
(45) Date of Patent: Sep. 25, 2007

(54) METHOD FOR MANUFACTURING AND OPERATING A NON-VOLATILE MEMORY

(75) Inventor: Hak Yun Kim, Cheongju-si (KR)

(73) Assignee: Magnachip Semiconductor, Ltd., Chungchongbuk-do (KR)

( * ) Notice: Subject to any disclaimer, the term of this patent is extended or adjusted under 35 U.S.C. 154(b) by 309 days.

(21) Appl. No.: 11/181,606

(22) Filed: Jul. 13, 2005

(65) Prior Publication Data

US 2007/0012992 A1    Jan. 18, 2007

(51) Int. Cl.
*H01L 21/336* (2006.01)

(52) U.S. Cl. .................. 438/257; 438/259; 438/264; 438/266

(58) Field of Classification Search ............. 438/257, 438/264, 593–594, 266, 259
See application file for complete search history.

(56) References Cited

U.S. PATENT DOCUMENTS

| | | |
|---|---|---|
| 5,486,480 A | 1/1996 | Chen |
| 5,728,593 A | 3/1998 | Yun et al. |
| 6,881,628 B2 * | 4/2005 | Rudeck ............... 438/259 |
| 2004/0108542 A1 * | 6/2004 | Lin et al. ............. 257/316 |
| 2004/0253787 A1 * | 12/2004 | Lee et al. ............ 438/257 |

\* cited by examiner

*Primary Examiner*—Thanh Nguyen
(74) *Attorney, Agent, or Firm*—Marshall Gerstein & Borun LLP

(57) ABSTRACT

A method for manufacturing and operating a nonvolatile memory in which a floating gate is formed on a silicon substrate to reduce the difference in heights between a memory region and a logic region so that a process margin is assured. The method includes forming first trenches having a designated depth and a second trench having a depth smaller than that of the first trenches, and filling the first and second trenches with an oxidation film; planarizing the oxidation film, and etching the oxidation film in the second trench so that the oxidation film remains at the central portion of the second trench; forming a tunnel oxidation film in the second trench from which the oxidation film is etched, and depositing a first polysilicon film thereon; etching the first polysilicon film back so that a 2-bit floating gate is formed in the second trench; removing the oxidation film in the second trench by wet etching, and forming a common source on the silicon substrate under the second trench by depositing a lower oxidation film and using the lower oxidation film as a buffer film; depositing a nitride film and an upper oxidation film on the resulting structure provided with the deposited common source; depositing a second polysilicon film on the entire surface of the upper oxidation film; and forming a control gate by etching the second polysilicon film.

7 Claims, 7 Drawing Sheets

METHOD FOR MANUFACTURING AND OPERATING A NON-VOLATILE MEMORY

BACKGROUND OF THE INVENTION

1. Field of the Invention

The present invention relates to a method for manufacturing and operating a nonvolatile memory, and more particularly to a method for manufacturing and operating a nonvolatile memory, in which a floating gate is formed on a silicon substrate to reduce the difference in heights between a memory region and logic region so that a process margin is assured when contact holes are subsequently formed.

2. Description of the Related Art

The functionally ideal memories available are nonvolatile semiconductor memories, which are easily programmed by switching their memory states using an electrical method voluntarily by a user, and maintain their memory states even when power is not supplied.

In terms of process technique, nonvolatile semiconductor memories (NVSM) are divided into floating gate memories and Metal-Insulator-Semiconductor (MIS) memories in which at least two kinds of dielectric films are stacked.

The floating gate memories exhibit memory characteristics using potential wells. For example, EPROM tunnel oxide (ETOX) structure is the most widely applied structure of recent flash EEPROMs. When the integration of the structure of an ETOX type flash cell is improved, a short channel effect occurs. In order to prevent the generation of leakage current of a floating gate and short between a source/drain contact and the floating gate, the cells must be separated from each other by a designated interval, thereby increasing the sizes of the cell.

Hereinafter, problems of the conventional nonvolatile memory will be described with reference to the accompanying drawings.

FIG. 1 is a schematic sectional view of a conventional nonvolatile memory. Now, a conventional method for manufacturing a flash memory is described with reference to FIG. 1, as follows. First, a shallow trench isolation (STI) film 110 for isolating memories from each other is formed on a silicon substrate 100, and a tunnel oxidation film 120 is formed thereon by thermal oxidation.

Then, a floating gate polysilicon film 130, an insulating film 140, such as an ONO dielectric film, and a control gate polysilicon film 150 are sequentially formed on the tunnel oxidation film 120, and a stack-type structure is obtained by photolithography and etching.

Thereafter, channel ion implantation (not shown) is performed, source/drain junction regions 160 are formed, and then an interlayer insulating film 170 is deposited thereon. Contact holes are formed by photolithography and etching such that the contact holes are connected to the source/drain junction regions 160, and a metal wiring 180 is formed on the contact holes.

According to the above conventional method for manufacturing the flash memory, since a floating gate is formed on the silicon substrate, the height of the floating gate causes difficulty in obtaining a contact margin when the contact holes are formed. As the memory has been minimized, the above problem is made more severe. Further, when the flash memory is integrated with a logic element into a single chip, a difference in heights between a logic region and a flash memory region is increased, thus decreasing the margin in a subsequent step of forming the contact holes.

SUMMARY OF THE INVENTION

Therefore, the present invention has been made in view of the above problems, and it is an object of the present invention to provide a method for manufacturing and operating a nonvolatile memory, in which a STI film is selectively etched and a floating gate is formed on the etched portion of the STI film to reduce the difference in heights between a memory region and a logic region, and a common source is formed under the floating gate to reduce a cell area.

In accordance with one aspect of the present invention, the above and other objects can be accomplished by the provision of a method for manufacturing a nonvolatile memory comprising: forming first trenches having a designated depth and a second trench having a depth smaller than that of the first trenches, and filling the first and second trenches with an oxidation film; planarizing the oxidation film, and etching the oxidation film in the second trench so that the oxidation film remains at the central portion of the second trench; forming a tunnel oxidation film in the second trench from which the oxidation film is etched, and depositing a first polysilicon film thereon; etching the first polysilicon film back so that a 2-bit floating gate is formed in the second trench; removing the oxidation film in the second trench by wet etching, and forming a common source on the silicon substrate under the second trench by depositing a lower oxidation film and using the lower oxidation film as a buffer film; depositing a nitride film and an upper oxidation film on the resulting structure provided with the deposited common source; depositing a second polysilicon film on the entire surface of the upper oxidation film; and forming a control gate by etching the second polysilicon film.

In accordance with another aspect of the present invention, there is provided a nonvolatile memory manufactured by the above method, which is an NOR type, and the data erasing and writing operations of which are performed by Fowler-Nordheim tunneling.

In accordance with yet another aspect of the present invention, there is provided a method for operating the above nonvolatile memory.

In the method for manufacturing and operating the nonvolatile memory of the present invention, the 2-bit floating gate is formed in the second trench of the silicon substrate, and the common source is formed under the floating gate, thereby reducing the difference in heights between the floating gate and a logic region. Further, when a logic gate is formed, the control gate is patterned together with the logic gate, thereby simplifying the process for manufacturing the memory.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
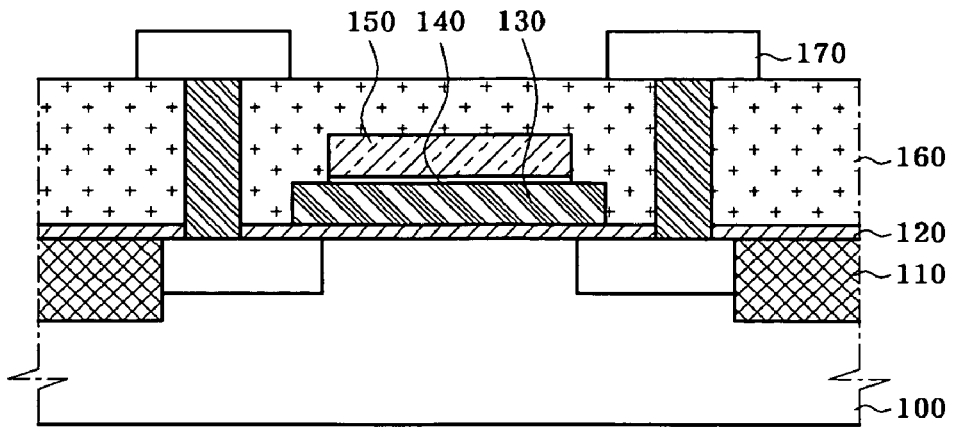
FIG. 1 is a schematic sectional view of a conventional nonvolatile memory.

Now, a preferred embodiment of the present invention will be described in detail with reference to the annexed drawings. The embodiment does not limit the scope and spirit of the invention, and has been disclosed for illustrative purposes. Some parts of the embodiment of the present invention, which are substantially similar to those of the prior art, are denoted by the same reference numerals even though they are depicted in different drawings.

FIGS. 2A to 2L are sectional views sequentially illustrating a method for manufacturing a nonvolatile memory in accordance with the present invention.

Figure 2A:
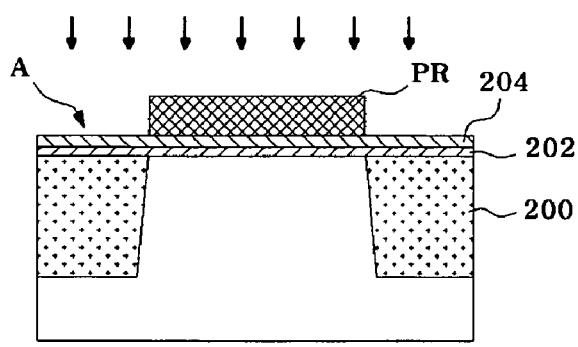
FIGS. 2A to 2L are sectional views sequentially illustrating a method for manufacturing a nonvolatile memory in accordance with the present invention.

First, as shown in FIG. 2A, in order to form a STI film, a pad oxidation film 202 and a pad nitride film 204 are deposited on a silicon substrate 200, and the silicon substrate 200 is etched using a photoresist pattern so that first trenches (A) having a first depth are formed in the silicon substrate 200.

Figure 2B:
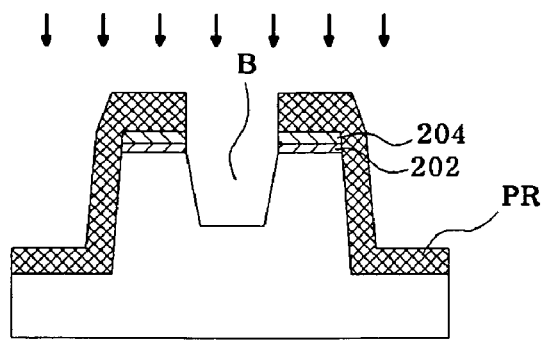

As shown in FIG. 2B, a photoresist pattern (PR) is formed such that the silicon substrate 200 at a floating and control gate formation regions of a cell area is exposed to the outside.

Figure 2C:
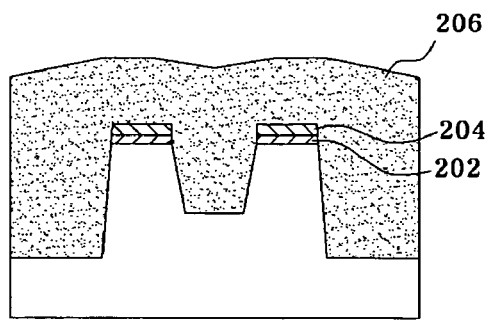

Etching is performed using the photoresist pattern (PR) as a blocking film. Thereby, the silicon substrate 200 is etched so that a second trench (B) having a second depth is formed in the silicon substrate 200. Then, as shown in FIG. 2C, an oxidation film 206 is deposited on the silicon substrate 200 so that the first and second trenches (A and B) are filled.

Figure 2D:
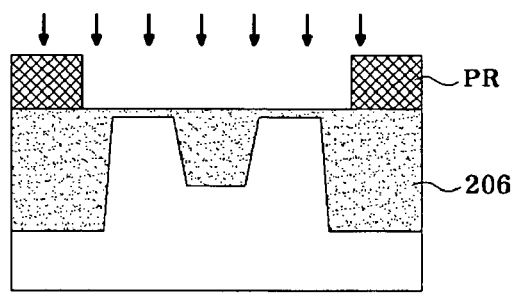
Figure 2E:
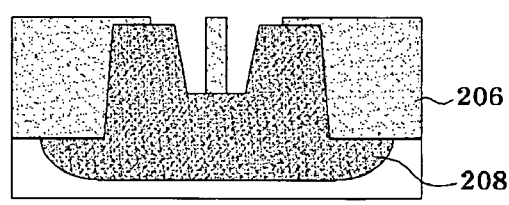

The oxidation film 206 is planarized, and ion implantation for forming a well 208 is performed, as shown in FIG. 2D. Then, as shown in FIG. 2E, in order to form a 2-bit floating gate on the second trench (B), the oxidation film 206 filling the second trench (B) is etched so that the oxidation film 206 only at the central portion of the second trench (B) remains.

Figure 2F:
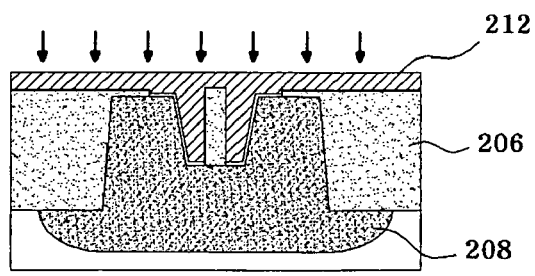
Figure 2G:
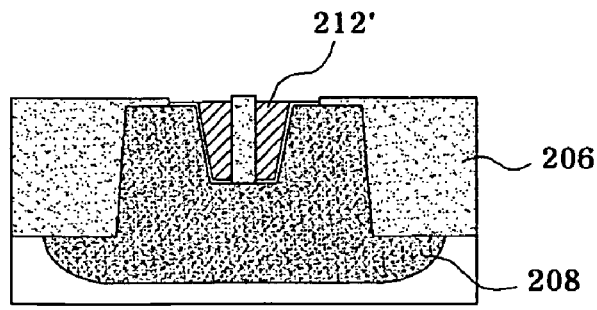

Thereafter, as shown in FIG. 2F, a tunnel oxidation film 210 is deposited and etched so that the tunnel oxidation film 210 remains only in the second trench (B), and a first polysilicon film 212 is deposited thereon. Then, as shown in FIG. 2G, a floating gate 212' is formed by an etch-back step. Here, since the floating gate 212' is patterned by the etch-back step, photolithography for forming the floating gate is not required. Accordingly, the process of manufacturing the flash memory is simplified.

Figure 2H:
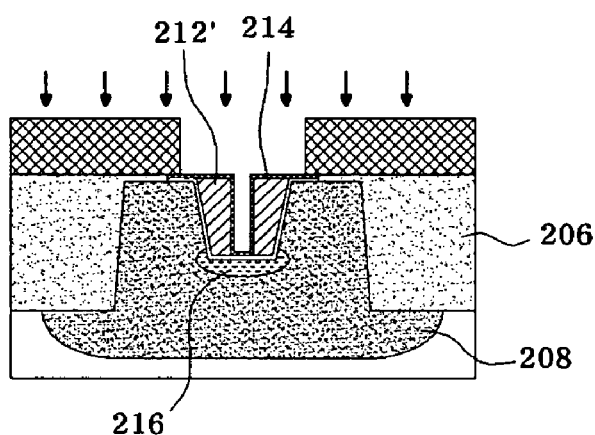

As shown in FIG. 2H, the oxidation film 206 in the second trench is removed by wet etching, a lower oxidation film 214 of an ONO dielectric film is deposited, and ion implantation using the lower oxidation film 214 as a buffer film is performed, thereby forming a common source 216. Here, since the oxidation film 214 is removed by wet etching, it is possible to prevent damage to the silicon substrate 200 generated when plasma etching is applied.

Figure 2I:
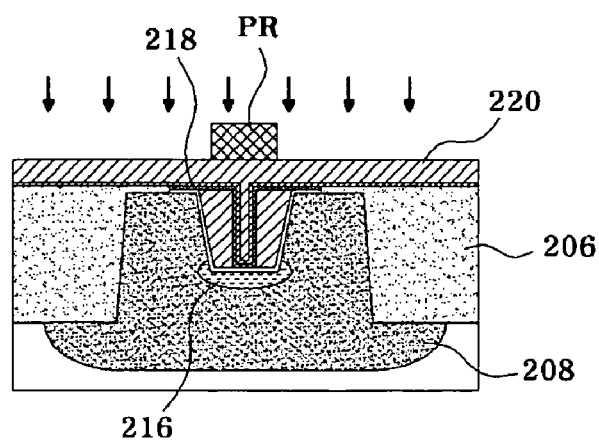

After the common source 216 is formed, a nitride and upper oxidation film 218 of the ONO dielectric film is deposited as shown in FIG. 2I. Then, a second polysilicon film 220 for forming a control gate is deposited thereon.

Figure 2J:
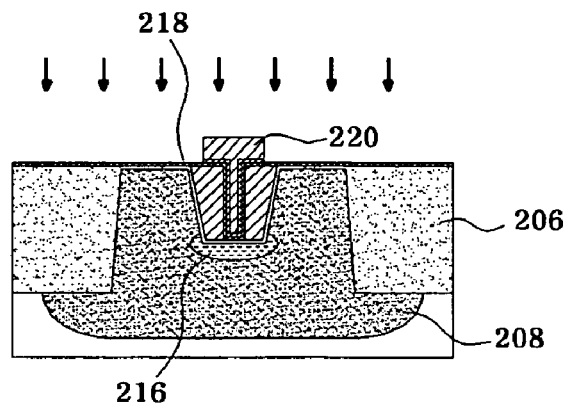

Thereafter, as shown in FIG. 2J, photolithography and etching are performed so that a control gate 220' is formed only on the upper surface of the floating gate 212'. Here, over-etching is performed using the ONO dielectric film, including the lower oxidation film 214 and the nitride and upper oxidation film 218, as an end point. After the etching is completed, the lower oxidation film 214, having a thickness of approximately 60 Å, remains. The remaining lower oxidation film 214 serves as a buffer oxidation film when ion implantation for forming drain junctions will be performed.

Figure 2K:
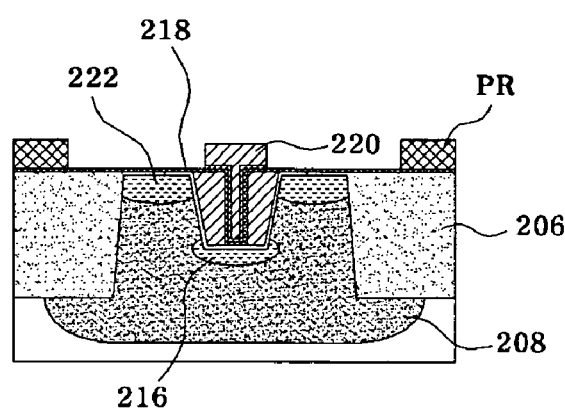

Thereafter, as shown in FIG. 2K, ion implantation is performed so that drains 222 are formed at both sides of the floating gate adjacent to the silicon substrate 200.

Figure 2L:
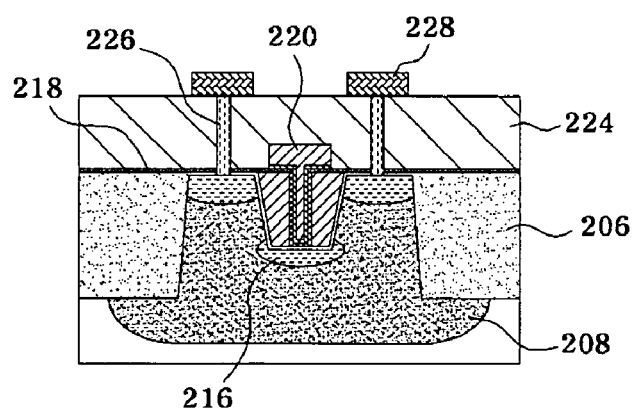

As shown in FIG. 2L, an interlayer dielectric film 224 is deposited so as to insulate memories from each other, and contact holes 226 are formed through the interlayer dielectric film 224 so that the contact holes 226 are connected to the drains 222, and are filled, thereby forming metal wirings 228.

Figure 3:
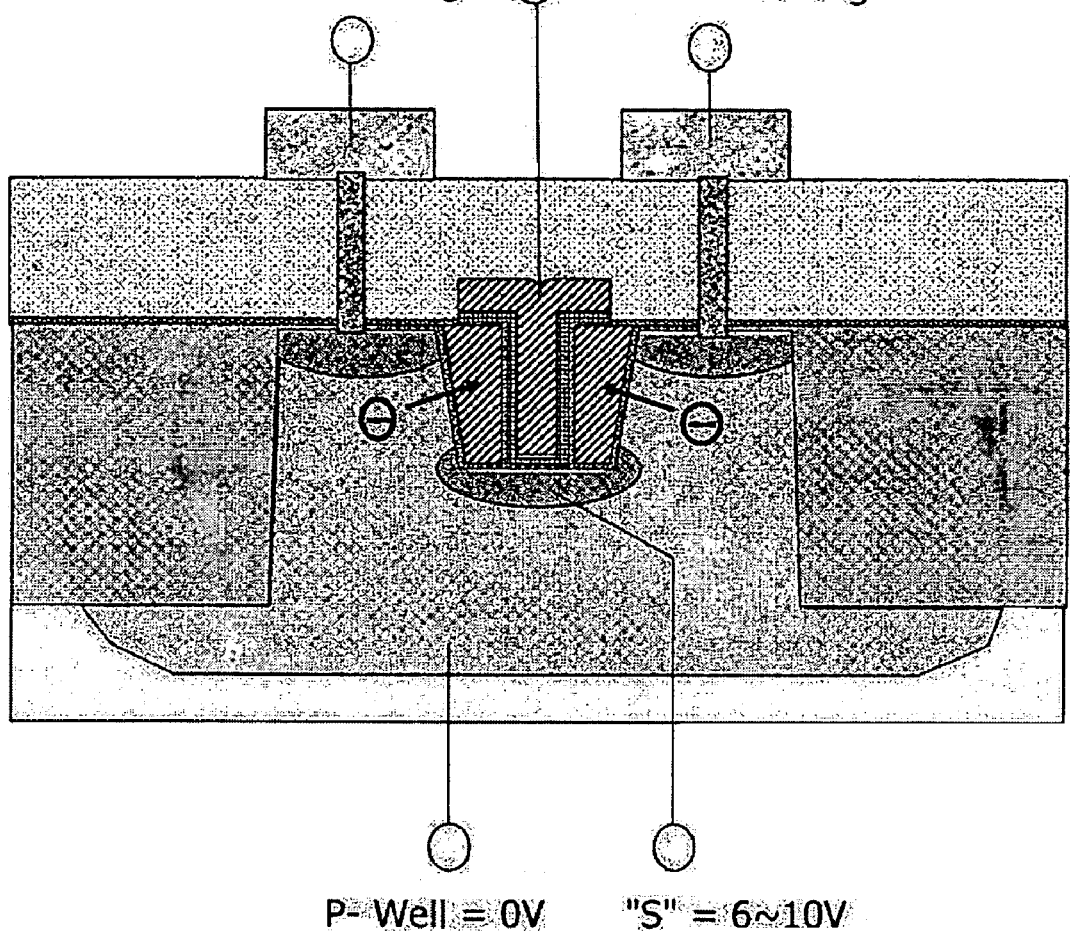
FIG. 3 is a schematic view illustrating the data erasing operation of the nonvolatile memory manufactured by the method of the present invention.

FIG. 3 is a schematic view illustrating the data erasing operation of the nonvolatile memory manufactured by the method of the present invention.

The data erasing operation refers to an operation making all cells in the same state. In the data erasing operation, the memory in an NOR type is operated in a bias condition for using Fowler-Nordheim tunneling. First, voltage of 0V is applied to the well, voltage of 7~10V is applied to the common source, and the drains are floated. High voltage usually of 14~20V is applied to the control gate. When voltages are applied to each of the memories as described above, electrons move to the inside of the floating gates of all of the cells so that threshold voltage is increased, and all the cells enter the same state so as to perform the data erasing operation.

Figure 4:
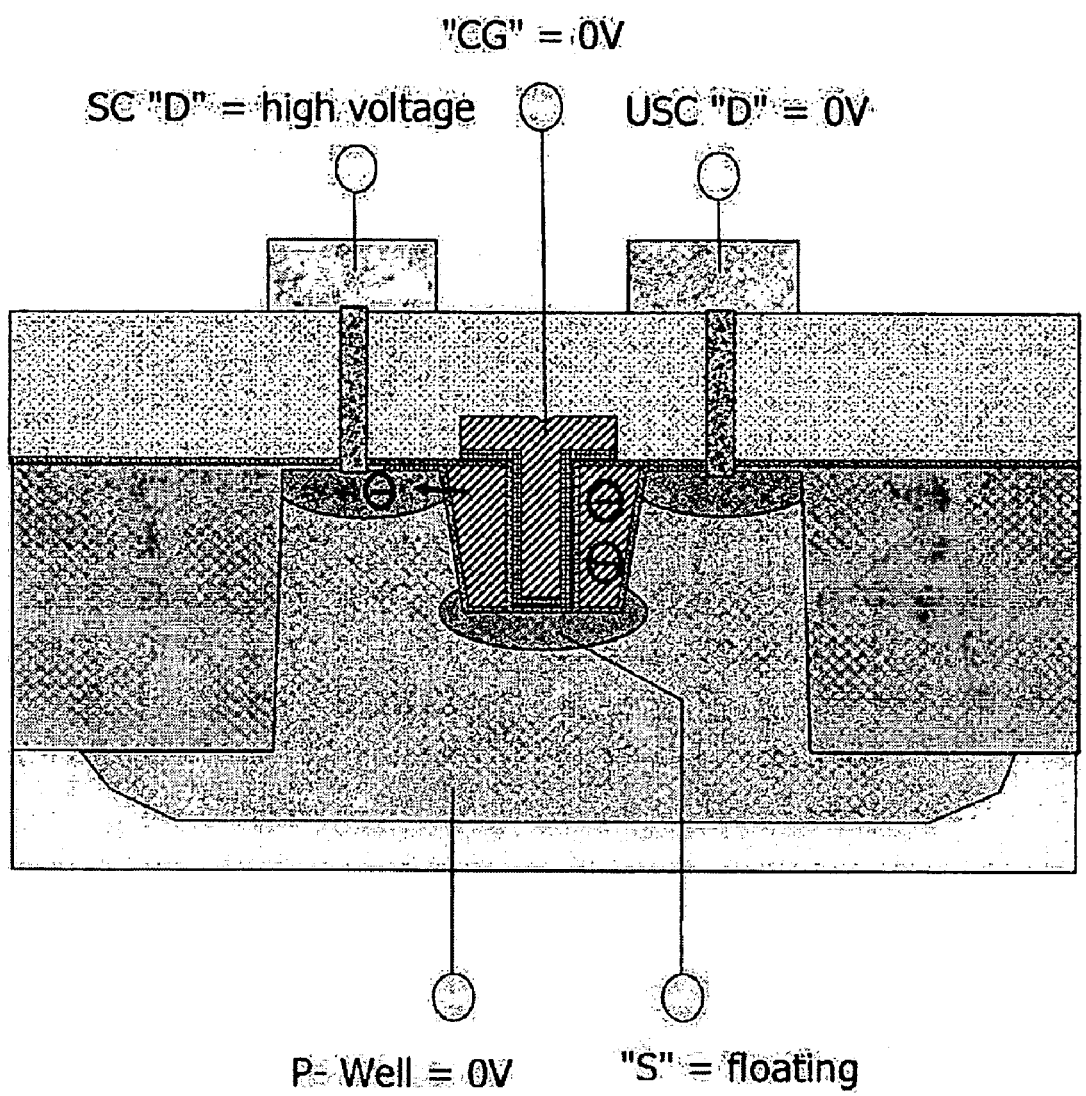
FIG. 4 is a schematic view illustrating the data writing operation of the nonvolatile memory manufactured by the method of the present invention.

FIG. 4 is a schematic view illustrating the data writing operation of the nonvolatile memory manufactured by the method of the present invention.

The data writing operation refers to an operation for making a selected cell to a state differing from the state of non-selected cells. In the data writing operation, the memory in the NOR type is operated such that electrons are removed from floating gates using Fowler-Nordheim tunneling on drain terminals. First, voltage of 0V is applied to the well, the common source is floated, high voltage usually of 14~20V is applied to the drains of the selected cell, and voltage of 0V is applied to the drains of the non-selected cells. Further, voltage of 0V is applied to the control gate. When voltages are applied to each of the memories as described above, electrons move from the floating gate of the selected cell to the drains of the selected cell, and changes the state of the selected cell into the state of the non-selected cells, thereby performing the data writing operation.

Figure 5:
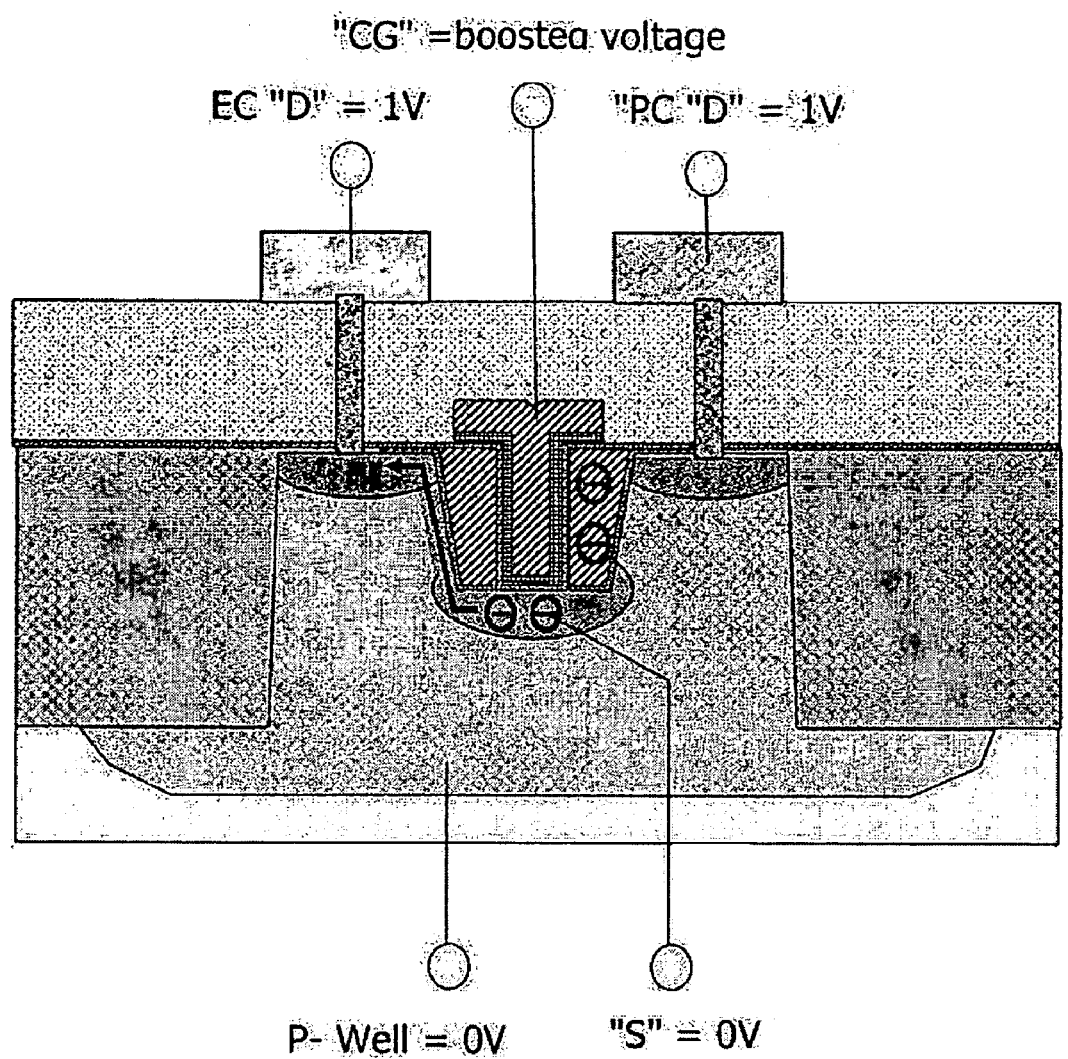
FIG. 5 is a schematic view illustrating the data reading operation of the nonvolatile memory manufactured by the method of the present invention.

FIG. 5 is a schematic view illustrating the data reading operation of the nonvolatile memory manufactured by the method of the present invention.

The data reading operation refers to an operation for reading whether or not the selected cell is in a data erasing state or data writing state, and a channel is formed from the common source to the drains in the vertical direction. First, voltage of 0V is applied to the well and the common source, and voltage of 1V is applied to drains of an erased cell and drains of a programmed cell. Further, voltage of 3~5V, which is the same as that applied to a general ETOX NOR type flash memory, is applied to the control gate. Thus, the vertical channel is formed from the common source to the drains, thereby performing the data reading operation.

As apparent from the above description, the present invention provides a method for manufacturing and operating a nonvolatile memory, in which a floating gate is formed in a STI film to reduce the difference in heights between a memory region and a logic region so that contact and electrical margins are assured when the memory and a logic element is integrated into a single chip, and, when a logic gate is formed, a control gate is patterned together with the logic gate so that the process of manufacturing the memory is simplified.

Further, since a common source is formed under the floating gate, the method of the present invention reduces the area of the cell. Moreover, since the floating gate is formed in the STI film, the method of the present invention prevents the generation of buzz on an ONO dielectric film and a tunnel oxidation film.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a nonvolatile memory comprising:
    forming first trenches having a designated depth and a second trench having a depth smaller than that of the first trenches, and filling the first and second trenches with an oxidation film;
    planarizing the oxidation film, and etching the oxidation film in the second trench so that the oxidation film remains at the central portion of the second trench;
    forming a tunnel oxidation film in the second trench from which the oxidation film is etched, and depositing a first polysilicon film thereon;
    etching the first polysilicon film back so that a 2-bit floating gate is formed in the second trench;
    removing the oxidation film in the second trench by wet etching, and forming a common source on the silicon substrate under the second trench by depositing a lower oxidation film and using the lower oxidation film as a buffer film;
    depositing a nitride film and an upper oxidation film on the resulting structure provided with the deposited common source;
    depositing a second polysilicon film on the entire surface of the upper oxidation film; and
    forming a control gate by etching the second polysilicon film.

2. The method as set forth in claim 1, wherein, in the formation of the control gate, the etching of the second polysilicon film is performed using the upper oxidation film as an etching stop film.

3. The method as set forth in claim 1, wherein, in the formation of the control gate, the etching of the second polysilicon film is performed such that the upper oxidation film and the lower oxidation film remain.

4. The method as set forth in claim 3, wherein drains are formed at both sides of the upper surface of the floating gate using the remaining oxidation films as a buffer film through ion implantation.

5. A method for operating a nonvolatile memory manufacture by the method as set forth in claim 1, wherein the nonvolatile memory is an NOR type, data erasing and writing functions of which are performed by Fowler-Nordhiem tunneling.

6. A method for operating the nonvolatile memory as set forth in claim 5, the data erasing operation of which is performed by applying a voltage of 0V to the common source and applying intermediate bias voltage out of high voltage to the control gate.

7. A method for operating the nonvolatile memory as set forth in claim 5, the data writing operation of which is performed by applying bias voltage to the drains so that Fowler-Nordheim tunneling from the floating gate to drain terminals is achieved.

* * * * *